(12) United States Patent
Bhowmick et al.

(10) Patent No.: US 9,257,300 B2
(45) Date of Patent: Feb. 9, 2016

(54) FLUOROCARBON BASED ASPECT-RATIO INDEPENDENT ETCHING

(71) Applicant: Lam Research Corporation, Fremont, CA (US)

(72) Inventors: Ranadeep Bhowmick, San Jose, CA (US); Eric A. Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 36 days.

(21) Appl. No.: 13/937,930

(22) Filed: Jul. 9, 2013

(65) Prior Publication Data

US 2015/0017809 A1    Jan. 15, 2015

(51) Int. Cl.

| | |
|---|---|
| *H01L 21/302* | (2006.01) |
| *H01L 21/461* | (2006.01) |
| *B44C 1/22* | (2006.01) |
| *C03C 15/00* | (2006.01) |
| *C03C 25/68* | (2006.01) |
| *C23F 1/00* | (2006.01) |
| *H01L 21/311* | (2006.01) |
| *H01L 21/3213* | (2006.01) |
| *H01L 21/033* | (2006.01) |

(52) U.S. Cl.
CPC .... *H01L 21/31144* (2013.01); *H01L 21/31116* (2013.01); *H01L 21/31138* (2013.01); *H01L 21/32139* (2013.01); *H01L 21/0337* (2013.01)

(58) Field of Classification Search
None
See application file for complete search history.

(56) References Cited

U.S. PATENT DOCUMENTS 5,328,558 A    7/1994    Kawamura 5,888,591 A *   3/1999   Gleason et al. .......... 427/522
6,911,067 B2    6/2005   Kolics et al.
7,297,190 B1   11/2007   Dordi et al.

FOREIGN PATENT DOCUMENTS

WO    2008/020267    *    2/2008

OTHER PUBLICATIONS

Agarwal et al., "Plasma atomic layer etching using conventional plasma equipment", J. Vac. Sci. Technol. A 27(1), Jan./Feb. 2009, pp. 37-50.
Rauf et al., "A molecular dynamics investigation of fluorocarbon based layer-by-layer etching of silicon and SiO2", Journal of Applied Physics 101, Feb. 15, 2007, 10 Pages.
Metzler et al., "Fluorocarbon assisted atomic layer etching of SiO2 using cyclic Ar/C4F8 plasma", Journal of Vacuum Science & Technology A, Dec. 12, 2013, 5 Pages.
Lai et al., "Aspect ratio dependent etching lag reduction in deep silicon etch processes", Journal of Vacuum Science & Technology A, Jun. 22, 2006, 7 Pages.

* cited by examiner

*Primary Examiner* — Stephanie Duclair
(74) *Attorney, Agent, or Firm* — Beyer Law Group LLP (57) ABSTRACT

A method for etching features into an etch layer disposed below a patterned mask is provided. At least three cycles are provided, where each cycle comprises providing an ion bombardment, by creating a plasma, of the etch layer to create activated sites of surface radicals in parts of the etch layer exposed by the patterned mask, extinguishing the plasma, exposing the etch layer to a plurality of fluorocarbon containing molecules, which causes the fluorocarbon containing molecules to selectively bind to the activated sites, wherein the selective binding is self limiting, and providing an ion bombardment of the etch layer to initiate an etch reaction between the fluorocarbon containing molecule and the etch layer, wherein the ion bombardment of the etch layer to initiate an etch reaction causes the formation of volatile etch products formed from the etch layer and the fluorocarbon containing molecule.

26 Claims, 6 Drawing Sheets

FLUOROCARBON BASED ASPECT-RATIO INDEPENDENT ETCHING

BACKGROUND OF THE INVENTION

Field of the Invention

The invention relates to a method of forming semiconductor devices on a semiconductor wafer. More specifically, the invention relates to etching a layer in the formation of semiconductor devices.

In forming semiconductor devices, some devices may be etched to provide wide and narrow features.

SUMMARY OF THE INVENTION

To achieve the foregoing and in accordance with the purpose of the present invention, a method for etching features into an etch layer disposed below a patterned mask is provided. At least three cycles are provided, where each cycle comprises providing by creating a plasma an ion bombardment of the etch layer to create activated sites of surface radicals in parts of the etch layer exposed by the patterned mask, extinguishing the plasma, exposing the etch layer to a plurality of fluorocarbon containing molecules, which causes the fluorocarbon containing molecules to selectively bind to the activated sites, wherein the selective binding is self limiting, and providing an ion bombardment of the etch layer to initiate an etch reaction between the fluorocarbon containing molecules and the etch layer, wherein the ion bombardment of the etch layer to initiate an etch reaction causes the formation of volatile etch products formed from the etch layer and the fluorocarbon containing molecule.

In another manifestation of the invention, a method for etching features into an etch layer disposed below a patterned mask is provided. At least one cycle is provided, wherein each cycle comprises providing an ion bombardment of the etch layer to create activated sites in parts of the etch layer exposed by the patterned mask, exposing the etch layer to a plurality of fluorocarbon containing molecules that selectively bind to the activated sites, wherein the selective binding is self limiting, and providing an ion bombardment of the etch layer to initiate an etch reaction between the fluorocarbon containing molecules and the etch layer.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
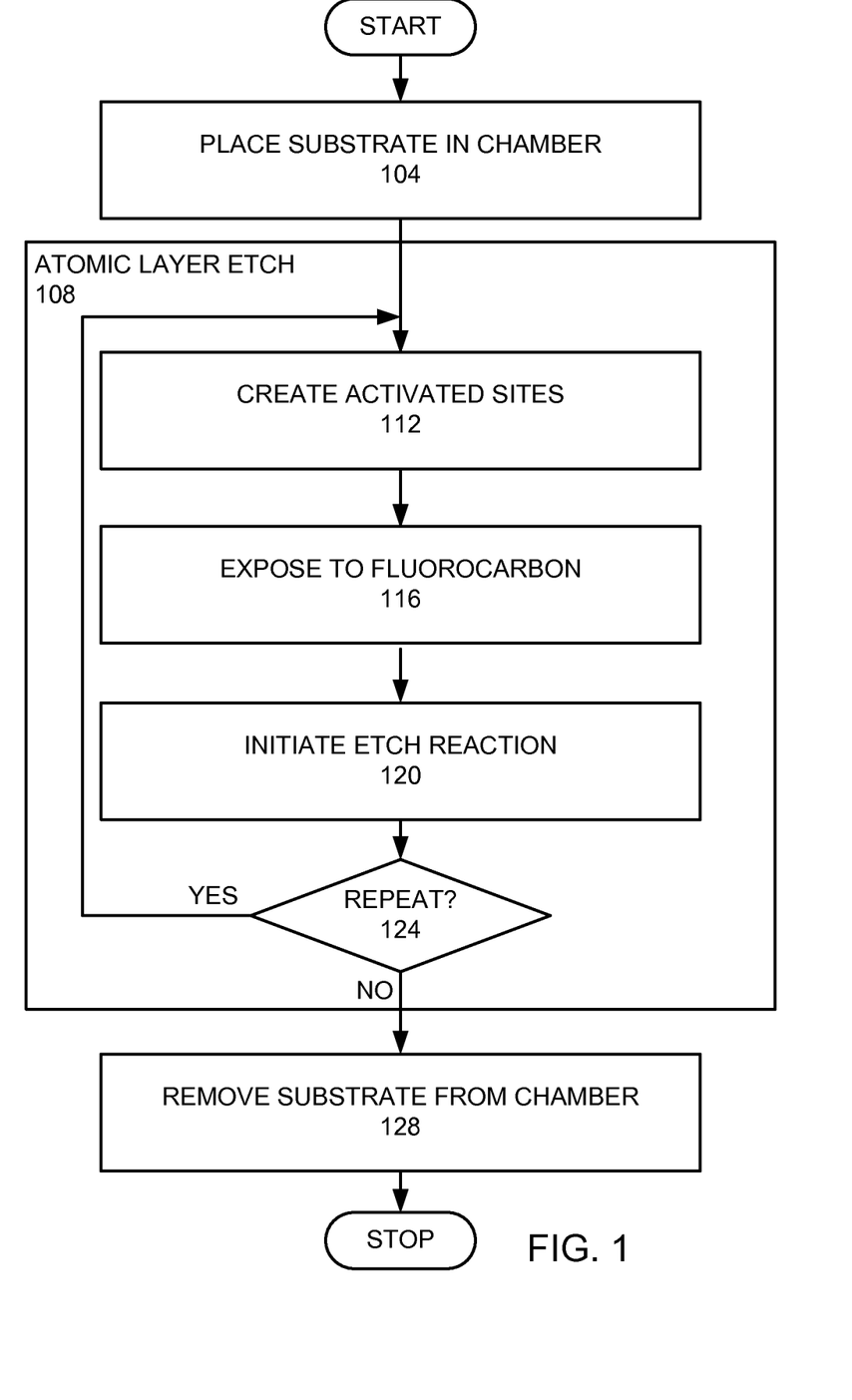
FIG. 1 is a high level flow chart of an embodiment of the invention.

FIG. 1 is a high level flow chart of an embodiment of the invention. In this embodiment, a substrate is placed in an etch chamber (step 104). Preferably, the substrate has an etch layer disposed below a patterned mask. The etch layer is etched using an atomic layer etch (step 108), using a fluorocarbon. Such an etch involves a cyclical process. In each cycle, activated sites are created (step 112). Ion bombardment of the exposed parts of the etched layer creates activated sites in the etch layer. The activated sites are exposed to fluorocarbon containing molecules (step 116), leading to attachment of some molecules to activated sites. An etch reaction is initiated between the fluorocarbon and the etch layer by ion bombardment (step 120). A determination is made whether to repeat the cycle (step 124). The substrate is removed from the chamber (step 128).

EXAMPLE

Figure 2A:
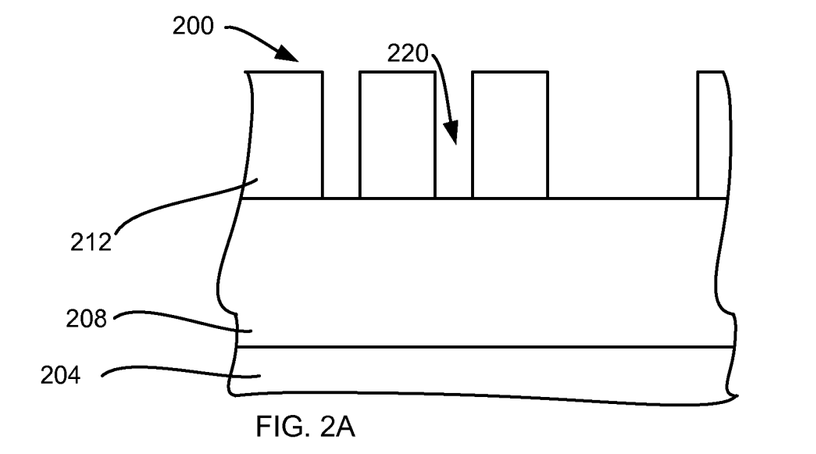
FIGS. 2A-E are schematic cross-sectional views of a stack processed according to an embodiment of the invention.

In a preferred embodiment of the invention, a substrate with an etch layer of silicon oxide disposed under a patterned mask is placed in an etch chamber (step 104). FIG. 2A is a schematic cross-sectional view of a stack 200 with a substrate 204 with an etch layer 208 disposed below a patterned mask 212. In this example, one or more layers may be disposed between the substrate 204 and the etch layer 208, or the etch layer 208 and the patterned mask 212. In this example, the patterned mask 212 is poly-silicon, and the etch layer 208 is a silicon oxide based dielectric. Other embodiments may use other key mask materials, such as spin-on organic mask layer and a-C, amorphous carbon (ACL). In this example, mask pattern features 220 have been formed in the patterned mask 212. In some embodiments, the mask pattern features 220 are formed before the substrate 204 is placed in the chamber. In other embodiments, the mask pattern features 220 are formed while the substrate 204 is in the chamber. As shown, some mask pattern features 220 may be wider than other mask pattern features 220. The width is not the only factor that affects shading—the shape of the hole also matters. In this example, one mask pattern feature 220 is several times wider than another mask pattern feature 220.

Figure 3:
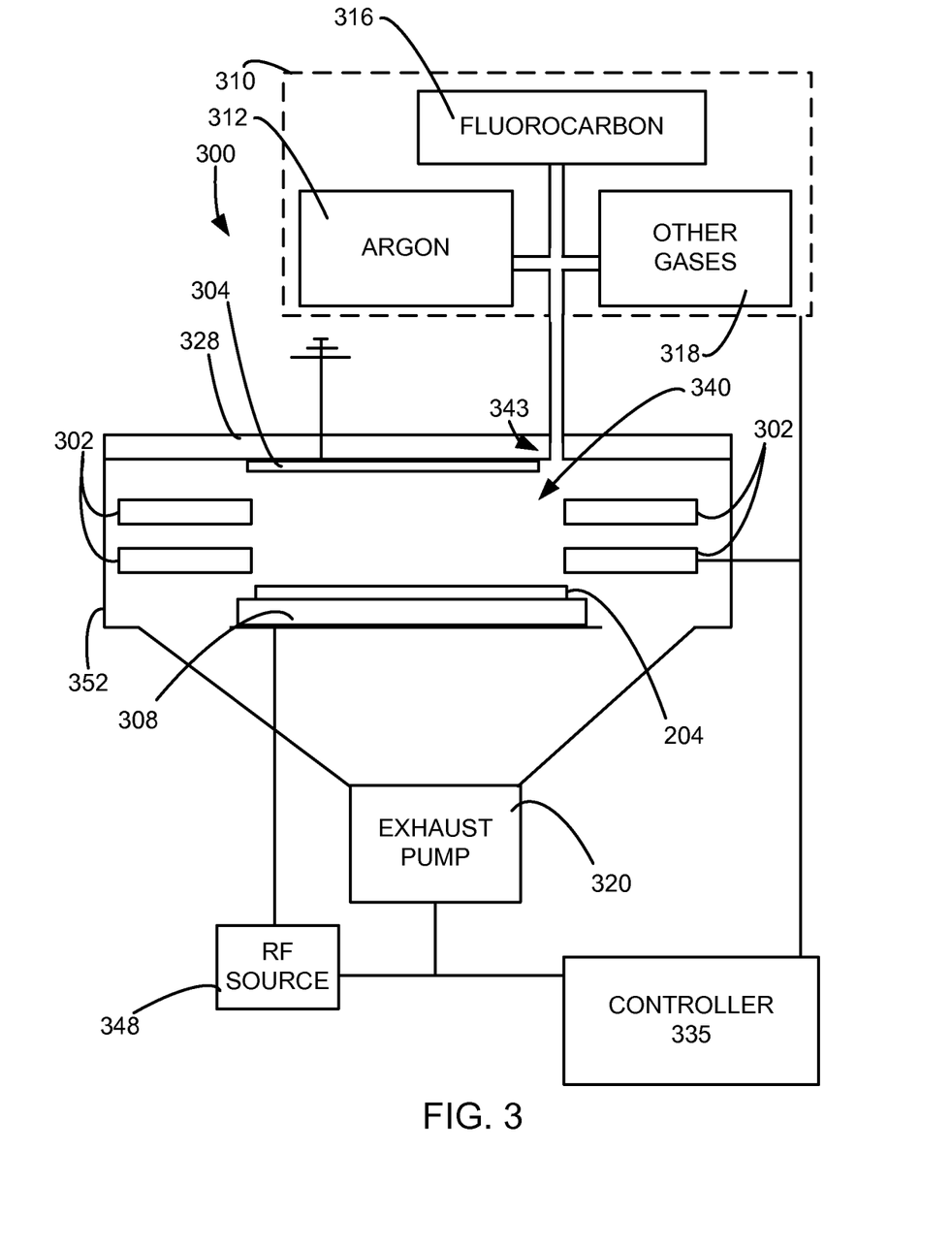
FIG. 3 is a schematic view of a plasma processing chamber that may be used in an embodiment of the invention.

FIG. 3 is a schematic view of a plasma processing chamber 300 that may be used for one or more of the following steps. The plasma processing chamber 300 comprises confinement rings 302, an upper electrode 304, a lower electrode 308, a gas source 310, and an exhaust pump 320. Within plasma processing chamber 300, the substrate 204 is positioned upon the lower electrode 308. The lower electrode 308 incorporates a suitable substrate chucking mechanism (e.g., electrostatic, mechanical clamping, or the like) for holding the substrate 204. The reactor top 328 incorporates the upper electrode 304 disposed immediately opposite the lower electrode 308. The upper electrode 304, lower electrode 308, and confinement rings 302 define the confined plasma volume 340. Gas is supplied to the confined plasma volume 340 through a gas inlet 343 by the gas source 310 and is exhausted from the confined plasma volume 340 through the confinement rings 302 and an exhaust port by the exhaust pump 320. Besides helping to exhaust the gas, the exhaust pump 320 helps to regulate pressure. In this embodiment, the gas source 310 comprises an argon gas source 312, a fluorocarbon containing gas source 316, and an additional gas source 318. The gas source 310 may further comprise other gas sources. An RF source 348 is electrically connected to the lower electrode 308. Chamber walls 352 surround the confinement rings 302, the upper electrode 304, and the lower electrode 308. Different combinations of connecting RF power to the electrode are possible. In a preferred embodiment, the 27 MHz, 60 MHz and 2 MHz power sources make up the RF power source 348 connected to the lower electrode 308, and the upper electrode 304 is grounded. A controller 335 is controllably connected to the RF source 348, exhaust pump 320, and the gas source 310. Preferably, the process chamber 300 is a CCP (capacitive coupled plasma) reactor, as shown. In other embodiments, an ICP (inductive coupled plasma) reactor or other sources like surface wave, microwave, or electron cyclotron resonance ECR may be used.

Figure 4:
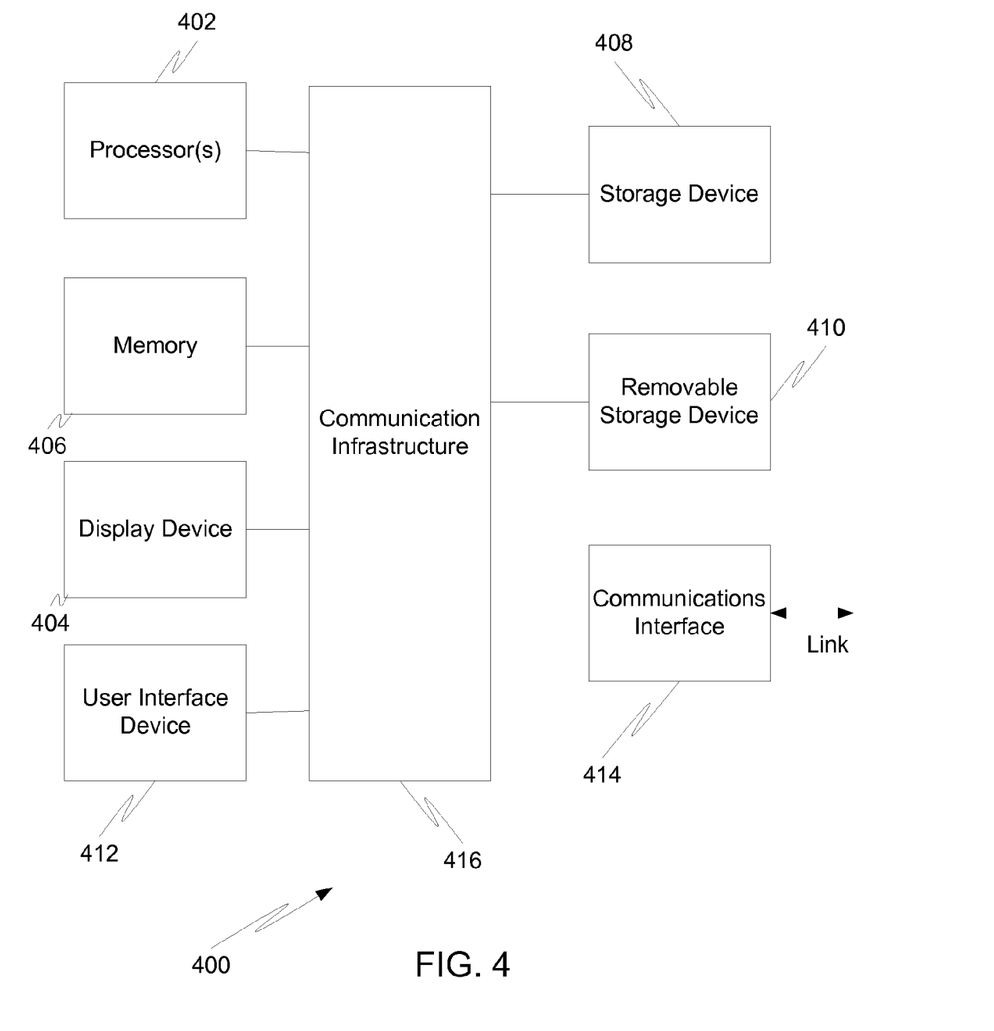
FIG. 4 is a schematic view of a computer system that may be used in practicing the invention.

FIG. 4 is a high level block diagram showing a computer system 400, which is suitable for implementing a controller 335 used in embodiments of the present invention. The computer system may have many physical forms ranging from an integrated circuit, a printed circuit board, and a small hand-held device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
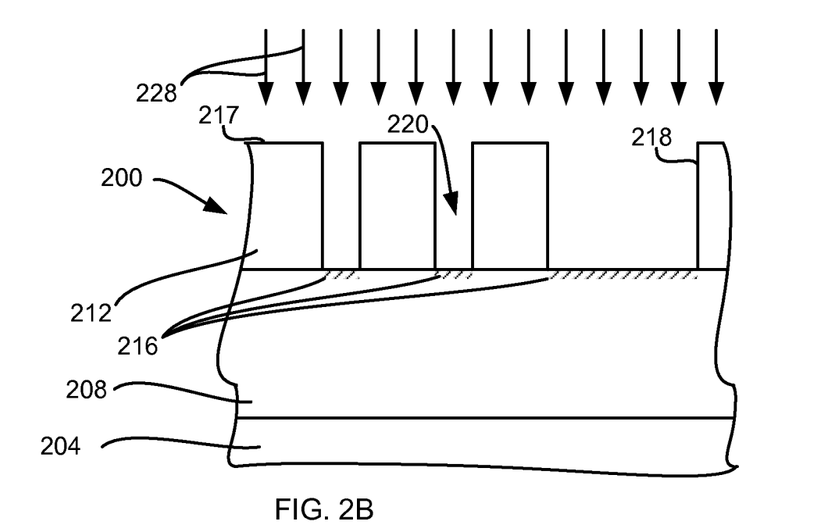

After the substrate 204 has been placed into the plasma processing chamber 300, the etch layer 208 is etched with an atomic layer etch (step 108). Activated sites are created (step 112) using ion bombardment. In this example, an Ar plasma is employed by providing a pressure of 50 mT and flowing 800 sccm Ar into the chamber. An RF input of 400 W at 60 MHz and 100 W at 27 MHz is provided to energize the Ar. A wafer temperature 20° C. is maintained. The process is maintained for 3 seconds. FIG. 2B is a schematic cross-sectional view of a stack 200 with a substrate 204 with an etch layer 208 disposed below a patterned mask 212 during the creation of activated sites 216 created by bombardment of argon ions 228. After the activated sites 216 are created, the argon ion bombardment 228 is stopped. The layer of activated sites 216 may be very thin, but are not drawn to scale, in order to illustrate the activated sites 216. Due to directionality of ion bombardment, the activated sites are preferentially created on horizontal surfaces including the surface of the etch layer 208, the surface of the mask layer 217. The sidewalls of the features 218 are minimally activated due to much ion lower flux and much lower energy transfer from ion collisions.

Figure 2C:
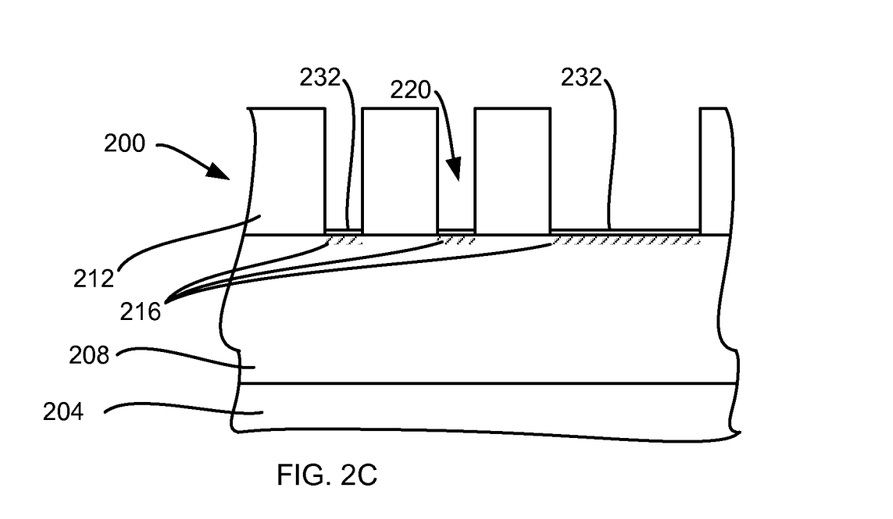

The etch layer 208 is then exposed to a deposition gas comprising fluorocarbon containing molecules (step 116). In this example, 1,3-hexaflurobutadiene (1-C4F6) is introduced at 20 sccm flow, at a pressure of 10 mT, a wafer temperature 20° C., with no RF excitation, for 3 seconds. FIG. 2C is a schematic cross-sectional view of a stack 200 with a substrate 204 with an etch layer 208 disposed below a patterned mask 212 after exposure to fluorocarbon containing molecules. The fluorocarbon containing molecules stick to the activated sites 216, so that the fluorocarbon containing molecules selectively deposit on the activated sites 216 to form a selective and self limiting deposition of fluorocarbon containing molecules 232. Due to selective nature of deposition, minimal fluorocarbon containing molecules stick to sidewalls which have minimal activated sites. After an activated site is occupied by a fluorocarbon containing molecule, the site is less active to subsequent fluorocarbon containing molecules, leading to a self-limited degree of fluorocarbon containing molecule surface coverage. At the exposed surface of the etch layer, there is a mixed layer of fluorocarbon containing molecules 232 and active sites 216. Below the mixed layer is the etch layer 208. Because the deposition of the fluorocarbon containing molecule is selective and self limiting, an almost evenly thick layer of fluorocarbon containing molecules is deposited on the bottoms of the features, independent of feature width and/or aspect ratio.

Figure 2D:
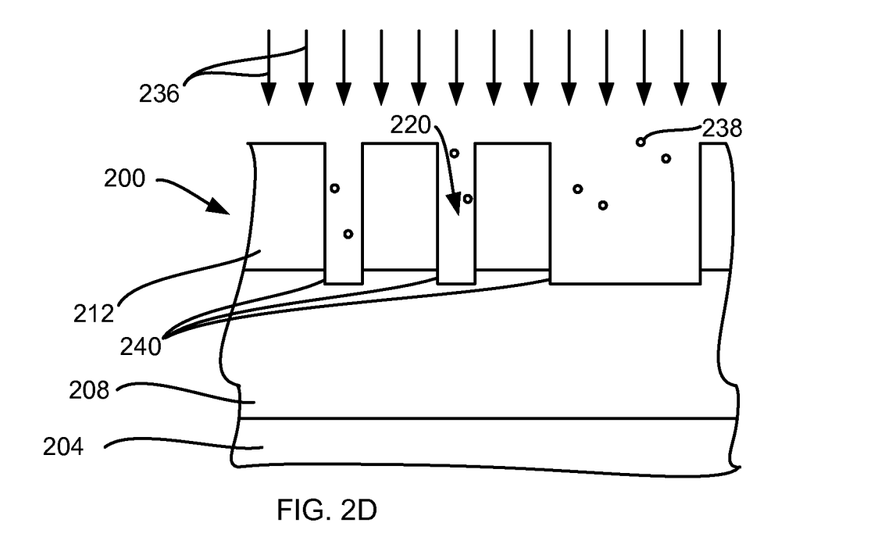

The etch reaction is initiated between the fluorocarbon containing molecule and the etch layer (step 120). In this embodiment, ion bombardment is used to initiate the etch reaction. In this example, the same recipe as used for activation above may be used here. FIG. 2D is a schematic cross-sectional view of a stack 200 with a substrate 204 with an etch layer 208 disposed below a patterned mask 212 during the initiation of the etch reaction by bombardment of argon ions 236. In this example, the ion bombardment causes the fluorocarbon molecule to react with the etch layer to create volatile products 238 from components of the fluorocarbon containing molecule and the etch layer. Some of the volatile products 238 from the etch reaction may be $SiF_4$, $SiF_2$, $CO_2$, and CO. The reaction is limited by the amount of fluorocarbon deposited. By providing a uniform amount or thickness of deposited fluorocarbon containing molecules on the etch layer surface, the amount of etching is made more uniform between features with different widths or aspect ratios. Preferably, the entire mixed layer is etched away. At the end of this cycle, partially etched features 240 are formed.

Figure 2E:
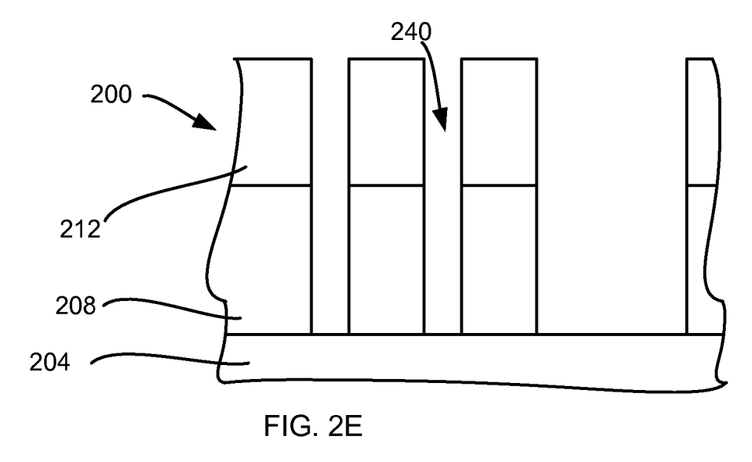

The etch cycle may then be repeated (step 124) as needed to increment the progress of the etch. After the etch steps are performed for a plurality of cycles, the etch is completed. FIG. 2E is a schematic cross-sectional view of a stack 200 with a substrate 204 with an etch layer 208 after the completed etching of features 240.

Because the activation by ion bombardment is highly directional and the fluorocarbon deposition is self limiting, the resulting etch is highly independent of geometry, aspect ratio, CD, and depth with minimal variations in within wafer uniformity and wafer to wafer repeatability. Although, the above preferred embodiment provides a dielectric etch to etch a dielectric etch layer, in other embodiments, the fluorocarbon etch may be used to etch other materials. The selectivity and self limiting of the fluorocarbon deposition is increased by using undissociated fluorocarbon containing molecules. Such molecules are more likely to stick to activated sites in a self limiting manner and less likely to stick to sites that are not activated, increasing selectivity and aspect ratio independence. In the above embodiment, the exposure and deposition of the fluorocarbon is plasma free to maximize the undissociated fluorocarbon containing molecules. To reduce exposure of the etch layer to dissociated or ionized fluorocarbon containing molecules, a pump and/or purge step for removing any residual fluorocarbon containing molecules which are not bound to active sites may be provided before a subsequent plasma ion bombardment to initiate a chemical reaction.

The use of 1,3-hexafluorobutadiene for the fluorocarbon containing molecule provides a fluorocarbon that is sufficiently reactive. Other embodiments may use Hexafluoropropylene oxide ($C_3F_6O$) or $C_2F_4$ as a fluorocarbon containing molecule.

In other embodiments, the selective deposition of the fluorocarbon containing molecule may occur as an exchange reaction, such that part of the original molecule is bound to the surface active site, and another part of the original molecule leaves the surface as a stable gas phase species. One such embodiment is for the molecule $C_3F_6O$ which might interact with a surface active site to form $C_2F_4O$ (gas phase species) and $CF_2$ (bound to surface). In this example, the undissociated $C_3F_6O$ fluorocarbon containing molecule is exposed to the etch layer and only the $CF_2$ portion of that molecule binds to the activated sites. Therefore the $C_3F_6O$ is a larger fluorocarbon containing molecule that reacts with an active site to produce a fluorocarbon containing molecule that selectively binds to the activated site.

In other embodiments, a low density plasma may be provided in situ or downstream, to provide some dissociated fluorocarbon containing molecules. In such low density plasmas, the electrons are less efficient at dissociating the gases. In the specification and claims, a low density plasma is defined as electron density between $10^7$ and $10^9$ electrons per $cm^3$. In addition, in the electron temperature is less than 4 eV In one embodiment, the downstream source is used to crack fluorocarbon containing gases away from wafer and then allows recombination into fluorocarbon species with desired reactivity (less reactive than direct plasma species). For example, c-$C_4F_8$ downstream may create a larger percentage of $CF_2$ and $C_2F_4$, which is desirable, and a lower percentage of other fluorocarbon radicals, which would tend towards non-selective deposition and therefore be less desirable.

In some embodiments, the plasma is extinguished after ion bombardment and before exposing the etch layer to the fluorocarbon containing molecules to increase the percentage of undisassociated fluorocarbon containing molecules that react at the activated sites. More preferably, most of the fluorocarbon containing molecules that reach the activated sites are undisassociated.

In one embodiment, a single monolayer of fluorocarbon containing molecules is attached to the etch layer, before the etch reaction is activated. Such an embodiment may only etch a corresponding thickness of the etch layer in each cycle, . The etched amount is proportional to deposited amount with a relationship defined by the stoichiometry of the etch reaction(s) and the limitation that the etch reaction stops when the fluorocarbon is fully consumed. In other embodiments, several layers of fluorocarbon containing molecules may be attached or deposited on the etch layer, possibly due to the transfer of surface active sites to new active sites within the attached molecules, and subsequent attachment of additional fluorocarbon-containing molecules to these new active sites. These embodiments would etch a corresponding thickness of etch layer, again defined by stoichiometry and the consumption of fluorocarbons. These embodiments provide a self limiting aspect of such depositions, so that even though more than a single molecular layer of the fluorocarbon containing molecule is deposited, such a deposition is self limited so that the amount of deposition does not exceed a limiting thickness. Termination of self-perpetuation molecular active sites is expected to occur eventually, due to pairs of sites on adjacent chains of molecules reacting and creating a terminated ring structure. In this way, multiple layers of fluorocarbon-containing molecules may deposit while providing a self limiting deposition. The thickness of deposited fluorocarbon containing molecules must be small enough to enable the ion-activated reaction to proceed in the next step. The specific limit to this thickness depends on the mass, speciation, and energy of the bombarding ions. Preferably, the self limiting fluorocarbon containing molecule deposition deposits a layer no greater than 6 nm. More preferably, the self limiting fluorocarbon containing molecule deposition deposits a layer no greater than 3 nm.

In various embodiments, the fluorocarbon containing molecule may have other elemental components such as hydrogen, nitrogen, and/or oxygen. These components may be useful to increase reactivity of molecules with surface activated sites. The carbon component of the fluorocarbon containing molecule is required to provide etch selectivity, to more selectively etch the targeted etch layer with respect to other layers, such as the patterned mask or an etch stop layer. The fluorine component is required to provide capability of etch removal of Si in target etch layers. In other embodiments, other gases such as Ne, Xe, or $N_2$, may be used in place of argon in the etch and surface activation steps. Preferably, such bombardment ions should not cause deposition and do not significantly etch the etch layer after the surface fluorocarbon is consumed.

Generally, the thicknesses of the fluorocarbon deposition on the bottoms of different features vary less than 2:1, where the aspect ratios of the features may vary as much as 0.1 to 10. The self-limiting aspect of the fluorocarbon deposition allows for the more uniform selective deposition.

Although in the above embodiment, the providing ion bombardment of the etch layer to initiate an etch reaction between the fluorocarbon and the etch layer and the providing an ion bombardment of the etch layer to create activated sites in parts of the etch layer exposed by the patterned mask are separate steps, in other embodiments, they may be the same step, which uses one bombardment to sequentially and/or simultaneously initiate an etch reaction and create active sites.

If the process is performed sufficient ion bombardment to create surface active sites but not enough to initiate the etch reaction, then a net atomic layer deposition of fluorocarbon containing molecules would result. This would work if the ion activation step was able to create active sites without initiating the etch reaction.

If a plasma of fluorocarbon containing molecules is used in fluorocarbon exposure step 116, some of the fluorocarbon containing molecules will dissociate to form fluorocarbon radicals, which attach to surfaces of the etch layer, without requiring activation sites, so that such a deposition is not self limiting, is less selective, and would be more dependent on feature width due to shading effects. During atomic layer etch cycling, due to geometries of the features, more etching will take place in wider or lower aspect ratio features than narrower or higher aspect ratio features.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for etching features into an etch layer disposed below a patterned mask, comprising performing at least three cycles, wherein each cycle comprises:
   providing by creating a plasma, an ion bombardment of the etch layer to create activated sites in parts of the etch layer exposed by the patterned mask;
   extinguishing the plasma;
   while the plasma is extinguished, exposing the etch layer to a plasma free gas comprising a plurality of fluorocarbon containing molecules, which causes the plurality of fluorocarbon containing molecules to selectively bind to the activated sites, wherein the selective binding is self limited by the number of activated sites; and
   providing an ion bombardment of the etch layer to initiate an etch reaction between the fluorocarbon containing molecules and the etch layer, wherein the ion bombardment of the etch layer to initiate an etch reaction causes the formation of volatile etch products formed from the etch layer and the fluorocarbon containing molecule.

2. The method, as recited in claim 1, further comprising removing unbound fluorocarbon containing molecules after exposing the etch layer to the plurality of fluorocarbon containing molecules and before providing the ion bombardment of the etch layer to initiate the etch reaction.

3. The method, as recited in claim 1, wherein each of the fluorocarbon containing molecules is part of a larger fluorocarbon containing molecule, wherein each larger fluorocarbon containing molecule reacts with at least one of the activated sites to produce at least one of the fluorocarbon containing molecules, each of which selectively binds to at least one of the activated sites.

4. The method, as recited in claim 1, wherein the plasma is created in a plasma chamber; wherein the step of providing an ion bombardment of an etch layer to create activated sites, the step of exposing the etch layer to a plasma free gas, and the step of providing an ion bombardment of the etch layer to initiate an etch reaction are performed in the plasma chamber; wherein the step of extinguishing the plasma comprises extinguishing the plasma within the plasma chamber; and wherein most of the fluorocarbon containing molecules that reach the activated sites are undissociated.

5. A method for etching features into an etch layer disposed below a patterned mask, comprising performing at least one cycle, wherein each cycle comprises:
   providing an ion bombardment of the etch layer to create activated sites in parts of the etch layer exposed by the patterned mask;
   exposing the etch layer to a plasma free gas comprising a plurality of fluorocarbon containing molecules that selectively bind to the activated sites, wherein the selective binding is self limited by the number of activated sites; and
   providing an ion bombardment of the etch layer to initiate an etch reaction between the fluorocarbon containing molecules and the etch layer.

6. The method, as recited in claim 5, wherein the ion bombardment of the etch layer to initiate an etch reaction causes the formation of volatile etch products formed from the etch layer and the fluorocarbon containing molecules.

7. The method, as recited in claim 6, wherein most of the fluorocarbon containing molecules that reach the activated sites are undisassociated.

8. The method, as recited in claim 7, wherein the providing the ion bombardment of the etch layer to create active sites is accomplished by creating a plasma, and further comprising extinguishing the plasma after providing the ion bombardment to create active sites and while exposing the etch layer to the plurality of fluorocarbon containing molecules.

9. The method, as recited in claim 8, wherein the ion bombardment provides an argon ion bombardment.

10. The method, as recited in claim 8, further comprising removing unbound fluorocarbon containing molecules after exposing the etch layer to the plurality of fluorocarbon containing molecules and before providing an ion bombardment of the etch layer.

11. The method, as recited in claim 8, wherein the fluorocarbon containing molecules comprise 1,3-Hexafluorobutadiene.

12. The method, as recited in claim 8, wherein the creation of activated sites creates surface radicals.

13. The method, as recited in claim 8, wherein the fluorocarbon containing molecules comprise hexafluoropropylene oxide $C_3F_6O$.

14. The method, as recited in claim 5, wherein the providing an ion bombardment of the etch layer to initiate an etch reaction between the fluorocarbon containing molecules and the etch layer and the providing an ion bombardment of the etch layer to create activated sites in parts of the etch layer exposed by the patterned mask are separate steps.

15. The method, as recited in claim 5, wherein most of the fluorocarbon containing molecules that reach the activated sites are undisassociated.

16. The method, as recited in claim 5, wherein the providing the ion bombardment of the etch layer to create active sites is accomplished by creating a plasma, and further comprising extinguishing the plasma after providing the ion bombardment to create active sites and while exposing the etch layer to the plurality of fluorocarbon containing molecules.

17. The method, as recited in claim 5, further comprising removing unbound fluorocarbon containing molecules after exposing the etch layer to the plurality of fluorocarbon containing molecules and before providing an ion bombardment of the etch layer.

18. The method, as recited in claim 5, wherein each of the fluorocarbon containing molecules is part of a larger fluorocarbon containing, wherein each larger fluorocarbon containing molecule reacts with at least one of the activated sites to produce at least one of the fluorocarbon containing molecules, each of which selectively binds to at least one of the activated sites.

19. A method for etching features into an etch layer disposed below a patterned mask, comprising performing at least three cycles, wherein each cycle comprises:
   creating activated sites in parts of the etch layer exposed by the patterned mask;
   exposing the etch layer to a plasma free gas comprising fluorocarbon containing molecules, wherein most of the fluorocarbon containing molecules are undissociated, which causes the fluorocarbon containing molecules to be deposited, wherein the extent to which the fluorocarbon containing molecules are deposited is self limited by the number of activated sites; and
   providing an ion bombardment of the etch layer to initiate an etch reaction between the deposited fluorocarbon containing molecules and the etch layer, wherein the ion bombardment causes the formation of volatile etch products formed from the etch layer and the fluorocarbon containing molecules.

20. The method, as recited in claim 19, further comprising removing undeposited fluorocarbon containing molecules after exposing the etch layer to the fluorocarbon containing molecules and before providing the ion bombardment of the etch layer to initiate the etch reaction.

21. The method, as recited in claim 19, wherein the providing the ion bombardment of the etch layer is accomplished by creating a plasma, and further comprising extinguishing the plasma after providing the ion bombardment and while exposing the etch layer to the fluorocarbon containing molecules.

22. The method, as recited in claim 19, wherein the ion bombardment provides an argon ion bombardment.

23. The method, as recited in claim 19, wherein the fluorocarbon containing molecules comprise 1,3-Hexafluorobutadiene.

24. The method, as recited in claim 19, wherein the fluorocarbon containing molecules comprise hexafluoropropylene oxide $C_3F_6O$.

25. The method, as recited in claim 19, wherein the at least three cycles is at least 10 cycles.

26. The method, as recited in claim 19, wherein the fluorocarbon containing molecules are deposited in a single monolayer.

* * * * *